United States Patent
Milanesi et al.

(10) Patent No.: US 6,462,557 B1
(45) Date of Patent: Oct. 8, 2002

(54) SYSTEM FOR THE COMPLETE DIAGNOSIS OF A DRIVER

(75) Inventors: Andrea Milanesi, Casalnoceto; Stefania Chicca, Vecchiano; Vanni Poletto, Casale Monferrato; Valerio Giorgetta, Moncucco Torinese; Stefano Sgatti, Imola; Sergio Vigna, Nichelino, all of (IT)

(73) Assignees: STMicroelectronics S.R.L., Agrate (IT); Magneti Marelli S.p.A., Milan (IT)

( * ) Notice: Subject to any disclaimer, the term of this patent is extended or adjusted under 35 U.S.C. 154(b) by 0 days.

(21) Appl. No.: 09/570,874

(22) Filed: May 15, 2000

(30) Foreign Application Priority Data

May 13, 1999 (EP) .............................. 99830294

(51) Int. Cl.[7] ........................... G08B 21/00; F02P 17/00
(52) U.S. Cl. ........................ 324/606; 324/380; 324/384
(58) Field of Search ................................ 324/380, 530, 324/399, 384, 382, 500, 606

(56) References Cited

U.S. PATENT DOCUMENTS

| | | | |
|---|---|---|---|
| 4,689,573 | * 8/1987 | Hilmer | 324/380 |
| 5,063,516 | 11/1991 | Jamoua et al. | 364/431.11 |
| 5,111,123 | 5/1992 | Hach et al. | 318/434 |
| 5,304,935 | 4/1994 | Rathke et al. | 324/415 |
| 5,438,489 | * 8/1995 | Judy et al. | 361/191 |
| 5,623,254 | 4/1997 | Brambilla et al. | 340/644 |
| 5,675,257 | * 10/1997 | Frus | 324/380 |

FOREIGN PATENT DOCUMENTS

| | | | |
|---|---|---|---|
| EP | 0 810 444 | 12/1997 | G01R/31/02 |
| WO | WO 91/16637 | 10/1991 | G01R/31/00 |

* cited by examiner

Primary Examiner—N. Le
Assistant Examiner—Vincent Q. Nguyen
(74) Attorney, Agent, or Firm—Lisa K. Jorgenson; Allen, Dyer, Doppelt, Milbrath & Gilchrist, P.A.

(57) ABSTRACT

A system for diagnosing a driver and detecting circuit anomalies therein includes: voltage comparator circuits for generating diagnostic logic signals, each of which indicates the existence of a corresponding type of anomaly; and a coding circuit to receive the diagnostic logic signals and to output information relating to an overall operating state of the driver. The coding circuit includes a first portion to provide at its output first logic input signals indicating the last anomaly to occur since a system reset operation. The coding circuit also includes a second portion for coding the first logic input signals. The second portion includes a sequential logic network to receive the first logic input signals and at least one second logic signal indicating the current operating phase of the driver. The second portion provides, as a function of the first and second logic signals, a stable internal state to determine the output information in the form of an N bit coded word. The N bit coded word is representative of the occurrence of an anomaly, of an absence of an anomaly in the current operating phase, or of an absence of an anomaly in any operating phase.

38 Claims, 4 Drawing Sheets

SYSTEM FOR THE COMPLETE DIAGNOSIS OF A DRIVER

FIELD OF THE INVENTION

The present invention relates to automobile engines, and, more particularly, to electronic control units for automobile engines.

BACKGROUND OF THE INVENTION

In automotive engines, electronic control units (ECUs) are used for driving actuator devices associated with the engines. ECUs include a central processing unit, such as a microprocessor, that controls the operation of the actuator devices via low power control signals. Each actuator device has an associated driver to raise the power of the control signals to a level sufficient to allow actuation. Multiple drivers can be formed in a single integrated semiconductor circuit.

For the engine to operate correctly, the central processing unit of the ECU requires a complete analysis of the operating state of the drivers in their different operating phases to detect temporary anomalies (for example, a short circuit to ground, a short circuit to the battery, and an open circuit to load) and take the corrective action. Diagnosis circuits are provided for this purpose that are associated with each driver and are typically formed in the same integrated circuit.

A signalling pin is commonly reserved on the integrated circuit for each driver to communicate the results of the diagnosis processes to the microprocessor, which supervises the control of the actuator devices. At least one bit of serial information is transmitted to each signalling pin to indicate anomalies. Either a logic low or logic high value may be used depending on the logic convention. In diagnosis systems which use a single bit to indicate anomalies, it is not possible to provide the microprocessor with further information about the type of anomaly detected.

In general, more complex systems provide a description of the type of anomaly encountered using an associated code. This description is stored internally within the integrated component and transmitted to the microprocessor as a serial word, which is then reset by the microprocessor after being read. Resetting arranges the diagnosis circuit for subsequent detection of the operating state of the driver. The code adopted includes a number of available bits to represent n separate combinations, of which n−1 combinations are reserved for the description of anomalies and one combination is reserved for coding the condition of "no anomaly detected."

Turning now to FIG. 1, a prior art diagnosis system for a driver D is illustrated in which the driver is a so-called "low-side" type that is supplied from a voltage supply source $V_{AL}$. A microprocessor control unit (not shown) provides the driver D with a logic control signal IN. For convenience, the actuator device which is controlled by the driver D via a driving signal $V_{out}$ is also not shown. The driver D is controlled in one of two possible operating phases as a function of the state of conduction of an electronic witch Q, which may be a MOSFET transistor, for example. The switch Q is driven at a control electrode by the logic control signal IN.

A first node A and a second node B of the driver D are connected to the inputs of corresponding first and second comparator circuits 10, 20. Both first and second comparator circuits 10, 20 also receive at their inputs the logic control signal IN from the microprocessor. The first comparator circuit 10 also receives an input short circuit to battery reference voltage $V_{shb}$. The second comparator circuit 20 receives an input short circuit to ground reference voltage $V_{shg}$ and an open circuit to load reference voltage $V_{open}$.

In a simple embodiment, the comparator circuits 10 and 20 respectively include one and two threshold comparator circuits to provide output logic diagnosis signals F1, F2, F3. The logic diagnosis signals F1, F2, F3 respectively indicate of the presence or absence of the anomalies short circuit to battery, short circuit to ground, and open circuit to load. The diagnosis signals F1, F2, F3 are transmitted to a memory and coding circuit MC which outputs a coded word on a state bus 30, where the coded word represents the detected operating state. The capacity of the state bus 30 is based upon the number of anomalies which the system is able to detect. In this example, since it is desired to recognise the above listed anomalies plus a condition of "no detected anomalies," only two bits are provided to convey this information.

The state bus 30 is connected to the input of a serial peripheral interface SPI, which also receives similar inputs from other diagnosis systems in the same integrated circuit. The serial peripheral interface SPI can be selected by the microprocessor of the control unit and can transmit the detected information to the microprocessor in a synchronised manner via a signalling pin 32. The memory and coding circuit MC is reset by the microprocessor via the reset signal RESET_MC once transmission has taken place.

The microprocessor is programmed to perform a recognition procedure for detecting the presence of anomalies and their extinction, and to drive the actuator device as a function of the recognised operating state of the corresponding driver. The microprocessor does not know the operating phase of the individual drivers (for example ON, OFF, high impedance) because the monitoring of such phases is usually delegated to an external time programming unit (TPU). As such, it is important that the microprocessor does not receive erroneous information about the presence or absence of anomalies.

A conventional diagnosis circuit is able to detect a given anomaly only in particular operating phases of the driver. For example, anomalies such as short circuit to battery in a driver of the type described above can only be detected during an activation (ON) phase of the circuit. Anomalies such as a short circuit to ground or an open circuit to load condition can only be detected during a phase in which the circuit is not active (OFF).

Accordingly, each time the information relating to an anomaly is reset, this anomaly cannot be further detected if the operating phase of the driver is simultaneously changed, even if the anomaly is still present. In such a case the operating state of the driver is identified by a "no anomaly detected" condition, and the microprocessor then erroneously proceeds to recognize extinction of the previous anomaly.

A further disadvantage of the prior art is the possibility of not detecting anomalies even during the operating phase of the driver in which they can be recognised. That is, between two consecutive readings by the microprocessor of the control unit, the memory and coding circuits of the prior art only detect and store the first anomaly encountered after resetting the information in the memory. Thus, subsequent anomalies are ignored, thereby causing an updating loss in the control unit.

SUMMARY OF THE INVENTION

An object of the present invention is to provide a system for diagnosis of a driver which overcomes the above disadvantages.

Another object of the present invention is to provide a coding of the anomalies that does not cause errors in recognition by the microprocessor; that is, to provide a coding of "no anomaly detected" only if the system has ascertained this condition during each of the operating phases of the driver. The system distinguishes the condition of "no detected anomaly in each operating phase" from a plurality of conditions of "no detected anomaly in the current operating phase."

A further object of the present invention is to provide a diagnosis system that is able to detect and code the last anomaly occurring in a series of concurrent anomalies, and that allows the control unit to perform a correct updating on the operating state of the driver under examination.

According to the invention, whenever an anomaly is detected, its presence is stored in a corresponding memory circuit, thus resetting information corresponding to other types of anomalies which may have been previously detected. Downstream of the memory circuit the system has a sequential logic network which receives input information updated to a last detected anomaly. The sequential logic network is a state machine and codes the operating state of the driver as a function of the detected anomalies.

The state machine receives a number of input logic signals equal to the number of anomalies recognisable by the system, a system reset signal indicating that the reading by the control unit has occurred, and a driver control signal indicating the current operating phase. The sequential network achieves an internal state corresponding to an operating state of the driver as a function of the received input logic signals. The sequential network makes available to a microprocessor (or to a serial interface circuit) a word of N bits on an output bus to describe the detected operating state.

In particular, if n anomalies are to be detected and there are k possible operating phases of the driver, the state machine recognises n operating states corresponding to the presence of each anomaly, k operating states corresponding to the condition of "no detected anomaly in the current operating phase", and one operating state corresponding to the condition of "no detected anomaly in each operating phase." As such, the value N will be defined by the equation $2N \geq n+k+1$.

Further improvement may be achieved by the use of an auxiliary driving module located in the path of the driver control signal leading to the driver. The auxiliary driving module allows the driver to be deactivated upon detection of an anomaly even in the operating phase in which the driver is activated by the control unit (i.e., the ON phase). This allows reactivation of the driver as soon as the control unit reads its operating state, which is followed by a resetting of the system. In addition, the auxiliary driving module is set up to deactivate the driver again whenever the system detects that the anomaly remains.

BRIEF DESCRIPTION OF THE DRAWINGS

Further advantages and characteristics of the present invention will become apparent from the following detailed description, given with reference to the attached drawings a provided purely by way of example and without limitation, in which.

DETAILED DESCRIPTION OF THE PREFERRED EMBODIMENTS

Figure 1:
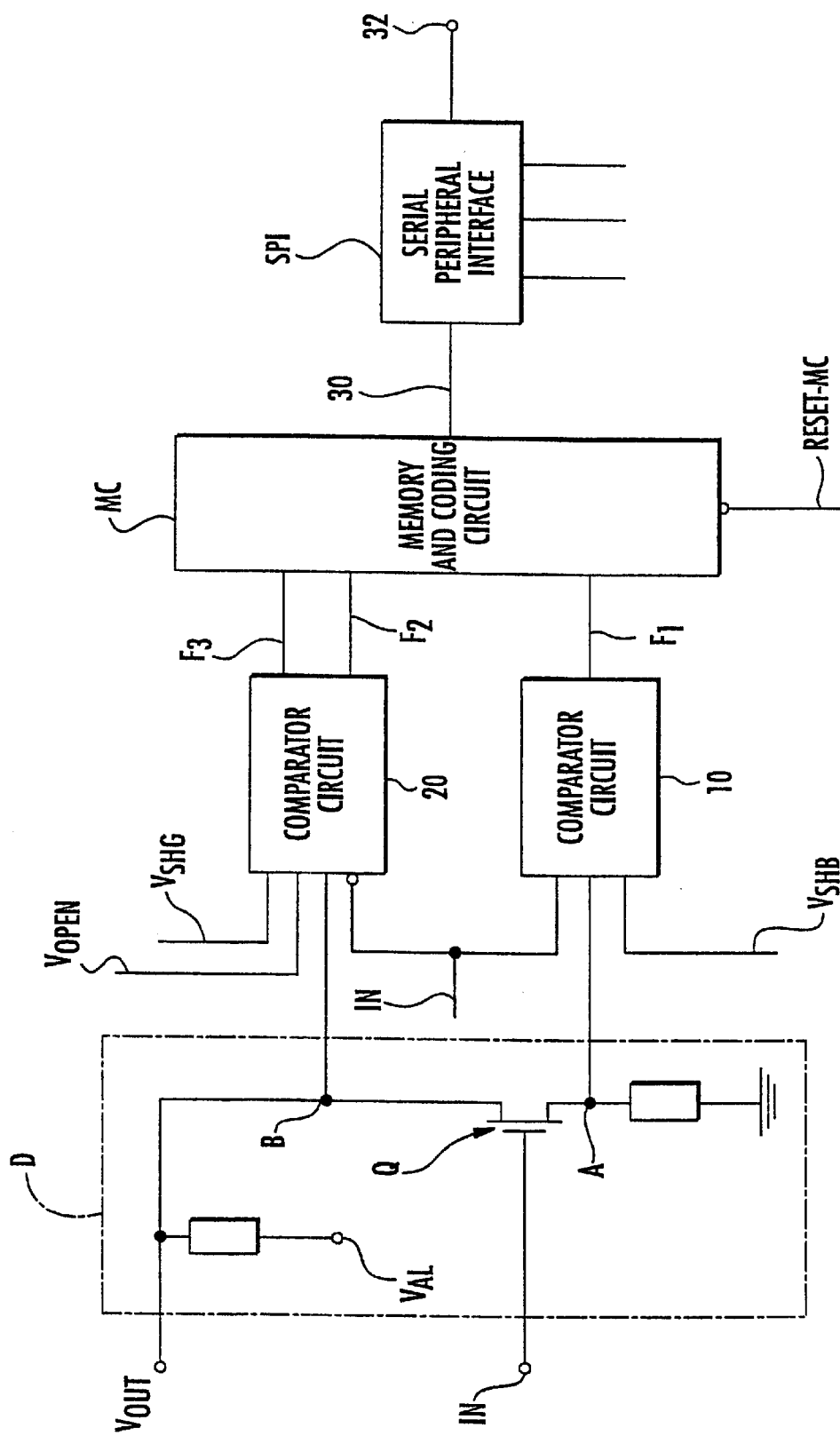
FIG. 1 is a schematic diagram of the previously described prior art diagnosis system.
Figure 2:
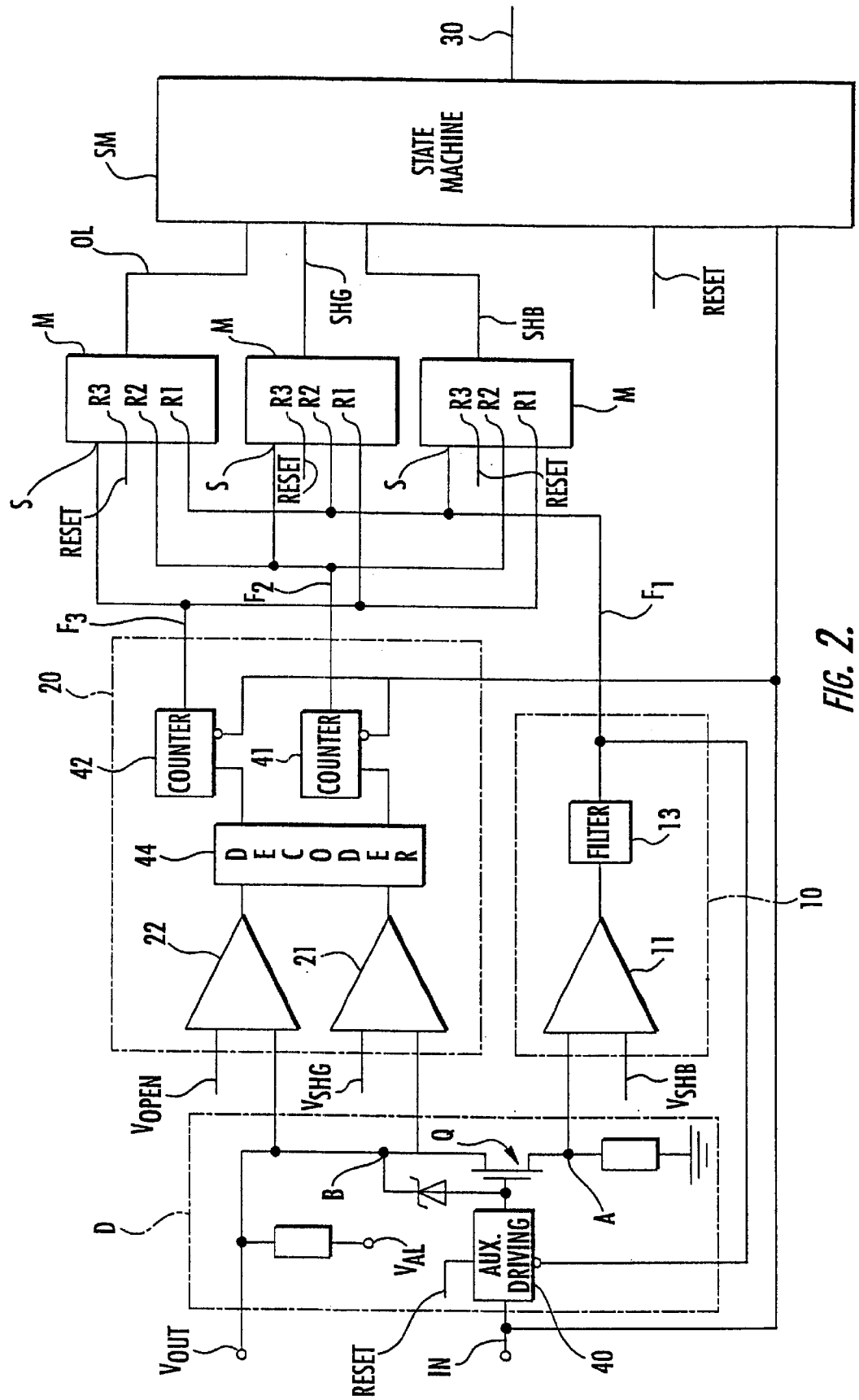
FIG. 2 is a schematic diagram of a diagnosis system according to the invention.
Figure 3:
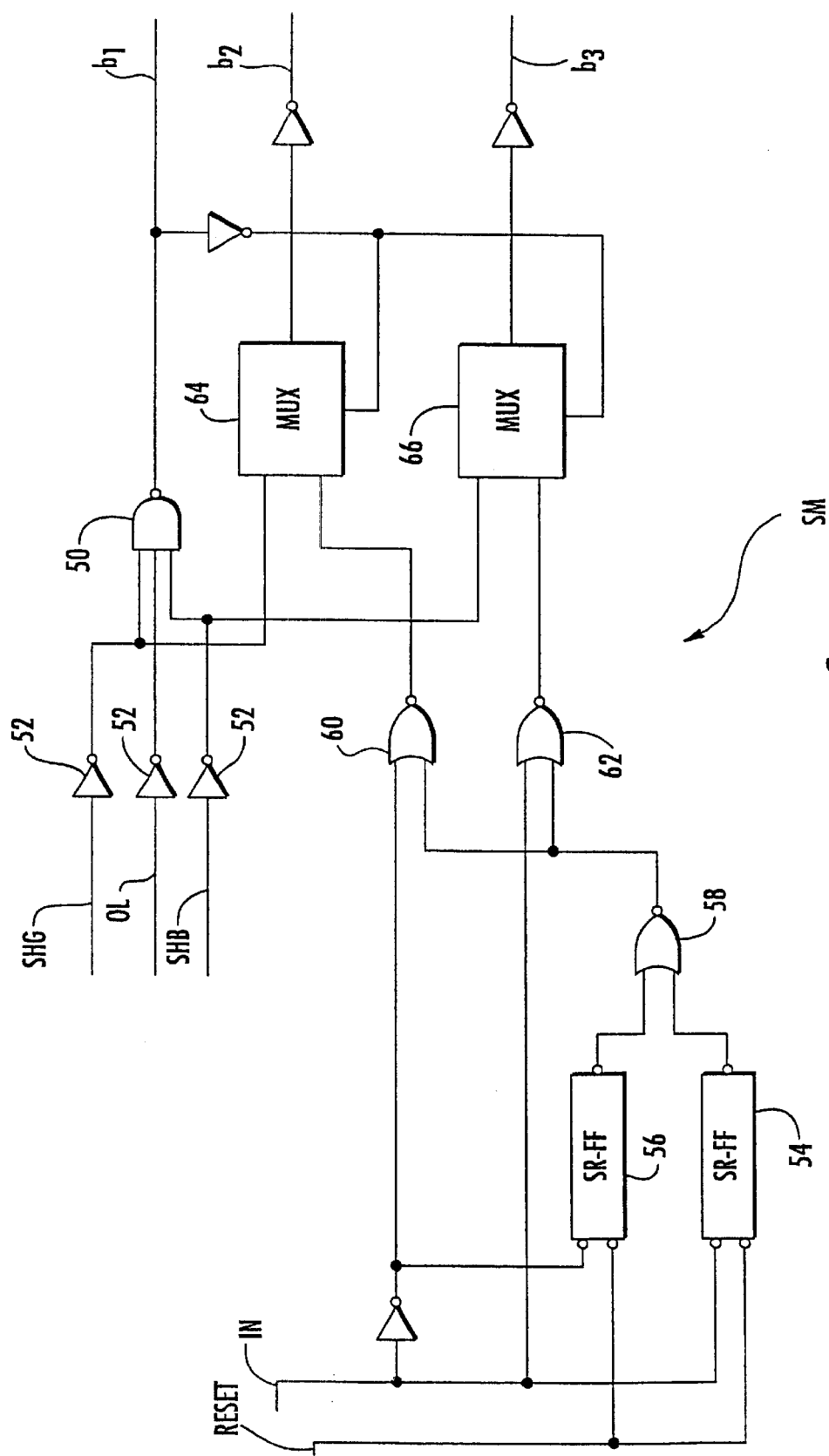
FIG. 3 is a schematic diagram of the sequential logic network of FIG. 2.
Figure 4:
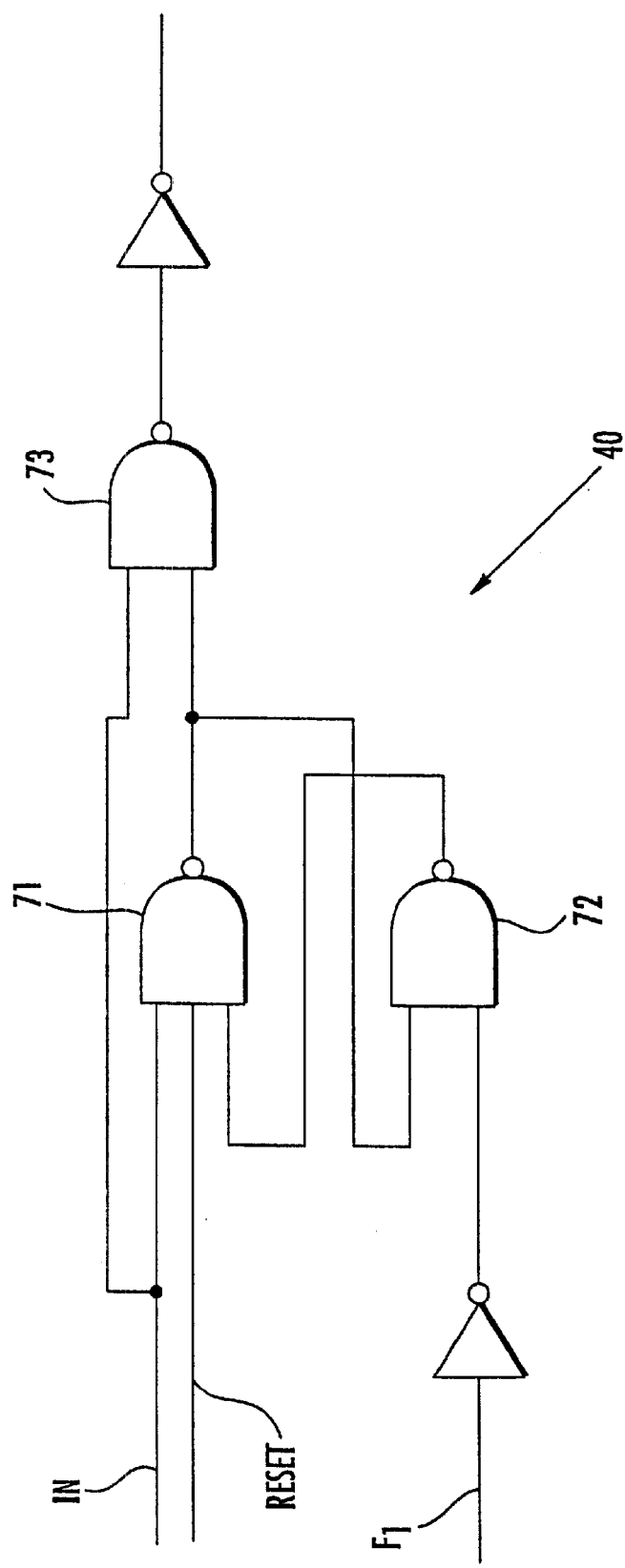
FIG. 4 is a schematic diagram of the auxiliary driving module of FIG. 2.

A diagnosis system according to the invention is described with reference to FIGS. 2 to 4, in which like numbers refer to like elements throughout, including those described above with reference to the prior art system of FIG. 1. The driver illustrated in FIG. 2 is of the so-called "low-side" type, similar to that of FIG. 1. The anomalies to be detected, for example, are short circuit to battery, short circuit to ground, and open circuit to load. Of course, those of skill in the art will appreciate that the invention may be used with other types of drivers and to detect different numbers or types of possible anomalies.

A driver D includes an auxiliary driving module 40 which receives, at a first input, a control logic signal IN output by the microprocessor control unit. The circuit D is controlled in one of a plurality of possible operating phases dependent upon the conduction state of an electronic switch Q. The electronic switch Q is driven at a control electrode by an auxiliary driving module 40. In turn, the driver D drives a corresponding actuator device (not shown) via a driving signal $V_{out}$ in a conventional manner known to those of skill in the art.

A first node A and a second node B of the driver D are connected to the inputs of corresponding first and second comparator circuits 10, 20. The first comparator circuit 10 recognizes a short circuit to battery and receives at its input a corresponding reference voltage $V_{shb}$. The second comparator circuit 20 recognises a short circuit to ground and an open circuit to load, and receives corresponding input reference voltages $V_{shg}$ and $V_{open}$. The first comparator circuit 10 outputs an overall diagnosis logic signal F1, and the second comparator circuit 20 provides at its outputs overall diagnosis logic signals F2, F3. The overall diagnosis logic signals F1, F2, F3 respectively indicate the presence or absence of the above anomalies.

The comparator circuit 10 includes a threshold comparator 11 to compare the voltage at the node A with the short circuit to battery reference voltage $V_{shb}$, and an analog filter 13 at the output of the threshold comparator. The diagnosis logic signal F1 is provided from the output of the analog filter and the comparator circuit 10.

The comparator circuit 20 includes two threshold comparators 21 and 22 to compare the voltage at the node B and, respectively, the short circuit to ground reference voltage $V_{shg}$ and the open circuit to load reference voltage $V_{open}$. The outputs of the threshold comparators 21, 22 are coupled to corresponding counters 41, 42, respectively, via a decoder 44. The counters 41, 42 receive at respective reset inputs the control logic signal IN output by the microprocessor control unit. The diagnosis logic signals F2 and F3 are provided from the outputs of the counters 41, 42 and the comparator circuit 20.

The diagnosis logic signals F1, F2, F3 are supplied to the inputs of memory circuits M, where the number of the memory circuits equals the number of different anomalies to be detected. The memory circuits M each receive a respective diagnosis logic signal F1, F2 or F3 at their set input S, and the other two diagnosis logic signals are connected to corresponding reset inputs R1 and R2. These memory circuits are each provided with a third reset input R3 and may receive a memory reset signal RESET thereon from the microprocessor via a serial peripheral interface SPI (not shown) following a reading of the operating state of the driver D.

First logic signals SHB, SHG, OL, are provided at the outputs of the memory circuits M and indicate, in their active state, respective anomalies that have since a last system reset operation. The combination of the signals SHB, SHG, OL is provided to the inputs of a sequential logic network, such as a state machine SM, which also receives the input logic control signal IN and the reset signal RESET.

The state machine SM outputs a coded word indicating the detected operating state of the driver D on a three bit state bus 30. The state bus 30 is then connected to the input of the serial peripheral interface SPI, which may be arranged to receive at its other inputs similar state buses from other diagnosis systems on the same integrated circuit. The serial peripheral interface SPI can be selected by the microprocessor and transmits the detected information to the microprocessor in a synchronized manner known to those of skill in the art.

The state machine SM will now be described in detail with reference to FIG. 3. The logic signals SHG, OL, SHB are provided to the input of a NAND gate 50 via respective inverter gates 52. The output signal from the NAND gate 50 is provided at a first output b1 of the state machine SM as the first bit of the coded word. Two set-reset flip-flops 54, 56 formed using NAND logic receive the control logic signal IN at respective set inputs. The control logic signal IN is first inverted before it reaches the set input of set-reset flip-flop 56. The set-reset flip-flops 54, 56 also receive the reset signal RESET at respective reset inputs. The outputs of both set-reset flip-flops 54, 56 are coupled together via a first NOR gate 58, and the resulting logic signal is supplied to the input of a pair of second NOR gates 60, 62, respectively. The pair of second NOR gates 60, 62 receive the control logic signal IN at respective second inputs, and the control logic signal is first inverted before being received by the second input of the NOR gate 60.

The outputs of the second NOR gates 60, 62 are respectively coupled to corresponding two-way multiplexer circuits 64, 66, which also receive the inverted signal SHG and the inverted signal SHB, respectively. The multiplexer circuits 64, 66 are controlled at their selection inputs by signals derived from the signal at the first output b1 of the state machine. The output signals from the multiplexers 64, 66 are respectively made available, via associated inverters, at the outputs b2 and b3 of the state machine as the remaining bits of the coded word.

The auxiliary driving module 40 will now be S described with reference to FIG. 4. The auxiliary driving module 40 includes a pair of NAND gates 71, 72 connected together in the configuration of a set-reset flip-flop, the set input of which receives the logic control signal IN and the reset signal RESET coupled together. The reset input receives the diagnosis logic signal F1 output by the comparator circuit 10, after the diagnosis logic signal is inverted. The output of the first NAND gate 71 is further coupled to the logic control signal IN via a third NAND gate 73, the output of which is provided to the output of the module 40 via an inverter. The first comparator circuit 10 is able to detect a short circuit to battery when the driver is active (i.e., the operating phase is ON because the switch Q is turned on), while the second comparator circuit 20 is able to detect a short circuit to ground and/or an open circuit to load when the driver is deactivated (i.e., the operating phase is OFF because the switch Q is turned off).

Each time the first or the second comparator circuit detects an anomaly during the operating phase of the driver in which they are active, they signal this condition by driving the corresponding signal $F_1$ (i =1, 2, 3) to a high logic value (or logic low according to the logic convention used). This signal is provided to the set input S of the memory circuit M to store the presence of this anomaly. The signal is simultaneously provided to a reset input R1 or R2 of the remaining memory circuits to reset the contents of such circuits and cancel any trace of the previously detected anomalies. In this way only the last anomaly which has occurred is stored. The memory circuits are reset by the RESET signal upon each reading by the control unit.

The combination of signals SHG, OL, SHB output from the memory circuits provides information about the absence of anomalies (i.e., a combination of 0, 0, , 0) or the identity of the last detected anomaly (a signal at a high logic value). This combination of signals is provided to the input of the state machine SM together with information relating to the current operating phase of the driver D and determines the subsequent state of the state machine as a function of its current state.

The state machine SM will provide the subsequent state at its output and converted into the corresponding coded word. The state machine SM is configured to output to the bus 30 a three bit word b3, b2, b1) which identifies all the possible combinations of operating states of the driver D in a unique manner, as set out in the following table:

| $b_3$ | $b_2$ | $b_1$ | Significance |
|---|---|---|---|
| 0 | 0 | 1 | open circuit to load |
| 0 | 1 | 1 | short circuit to ground |
| 1 | 0 | 1 | short circuit to battery |
| 0 | 1 | 0 | no anomaly detected in the operating phase OFF |
| 1 | 0 | 0 | no anomaly detected in the operating phase ON |
| 1 | 1 | 0 | no anomaly detected in any operating phase |
| 1 | 1 | 1 | not used |
| 0 | 0 | 0 | not used |

The state machine SM may be arranged to signal the presence of an anomaly by driving the output b1 at a high logic value and by coding the type of anomaly by the combination of the outputs b2 and b3. A signal SHG, OL or SHB, which has a high logic value, drives a signal of low logic value at a corresponding input of the NAND gate 50 (see FIG. 2) because of the presence of the inverters 52 in their signal paths. Since the inputs of a NAND gate are active for a low logic value, the condition in which at least one signal SHG, OL or SHB has a high logic value will make the output b1 a high logic value as well. At the same time, a low logic value is established at the selection input of the multiplexers 64, 66 and causes them to transmit the signals SHG and SHB to the outputs b2 and b3, respectively.

If a short circuit to the battery is detected during the ON operating phase of the driver D, the auxiliary driving module 40 actively intervenes. When the anomaly is detected, the signal F1 assumes a high logic value and the module 40 outputs a signal to turn off the switch Q and deactivate the driver D. After the operating state of the circuit is read by the control unit upon the system reset command (i.e., when the RESET signal assumes a high logic value), the module 40 prepares itself to reactivate the driver D if it simultaneously receives a control logic signal IN to return the driver D to the ON operating phase. If the system detects that the anomaly remains, the module 40 again outputs a signal to turn off the switch Q and deactivate the driver D after a delay time interval determined by the analogue filter 13. However, if the anomaly is no longer present, the module 40 transmits the control logic signal IN directly from the control unit to the switch Q.

If no anomaly is detected, the machine SM commands the output b1 to a low logic value and, by combination with the outputs b2 and b3, produces three separate codes of an operating state which excludes the presence of anomalies. The three separate codes respectively distinguish the cases in which, starting from the last reading by the control unit (i.e., a high logic value of the RESET signal), no anomaly state is detected in the current operating phase (ON or OFF) or in both possible operating phases.

If the signals SHG, OL and SHB have a low logic value so that all the inputs of the NAND gate 50 receive a high logic value signal, the output b1 has a low logic value and, at the same time, a high logic value is established at the selection input of the multiplexers 64, 66. The multiplexers 64, 66 thus transmit to the outputs b2, b3 the signals received by the circuit network portion that recognizes the operating phases which have occurred following a system reset command.

The embodiments and implementation details described above by way of example can be widely varied without departing from the scope of the present invention. For example, the embodiment described can be adapted for a diagnosis system of other types of drivers and for other numbers of operating states to be detected. This may be done by providing a number of memory circuits equal to the number of anomalies to be detected and a state machine to translate a predetermined coding law in a logic circuit. A state machine of this type should have a sufficient number of inputs to receive a corresponding number of logic signals, where the logic signals indicate the anomalies encountered and carry information about the current operating phase of the driver D and activation of a memory circuit reset command. Such a state machine should also include a number of outputs providing a sufficient number of combinations to represent the entire set of possible operating states.

That which is claimed is:

1. A system for diagnosing a driver and detecting anomalies therein, the driver having at least one diagnosis node and a voltage associated therewith and operating in a plurality of operating phases, the system comprising:

a voltage comparator for comparing the voltage from the at least one diagnosis node to at least one reference voltage and generating a plurality of diagnosis logic signals each indicating a respective type of anomaly; and a coding circuit for receiving the plurality of diagnosis logic signals and providing information relating to an overall operating state of the driver, the information being recognizable by a control unit of the driver, the coding circuit comprising a first circuit portion for storing the plurality of diagnosis logic signals and providing a plurality of corresponding first logic signals each indicating a respective last anomaly to occur after a system reset operation, and a second circuit portion for coding the plurality of first logic signals.

2. The system of claim 1 wherein said first circuit portion comprises a respective memory element for each anomaly to be tested, each memory element having a set input for receiving one of the diagnosis logic signals and a plurality of reset inputs for receiving the remaining diagnosis logic signals and a third logic signal indicating a system reset operation.

3. The system of claim 1 wherein said second circuit portion comprises a sequential logic network having a plurality of inputs and providing a coded word having a plurality of bits and indicating either the presence or absence of an anomaly; and wherein said sequential logic network receives at one input one of the first logic signals and at another input a second logic signal indicating the current operating phase of the driver.

4. The system of claim 3 wherein said sequential logic network provides a stable internal state as a function of the plurality of first logic signals and the second logic signal and outputs the coded word when one of the first logic signals reaches a predetermined logic value indicating the presence of an anomaly.

5. The system of claim 3 wherein said sequential logic network provides a stable internal state as a function of the plurality of first logic signals and the second logic signal and outputs the coded word when the plurality of first logic signals fail to reach a predetermined logic value indicating the presence of respective anomalies where the failure has not been checked for each operating phase of the driver since a system reset operation.

6. The system of claim 3 wherein said sequential logic network provides a stable internal state as a function of the first logic signals and the second logic signal and outputs the coded word when the plurality of first logic signals fail to reach a predetermined logic value indicating the presence of respective anomalies where the failure has been checked for an operating phase of the driver since a system reset operation.

7. The system of claim 3 wherein the plurality of bits comprises N bits; and wherein N is calculated as a function of a number n of anomalies to be detected and a number k of possible operating phases of the driver according to the formula $2N \geq n+k+1$.

8. The system of claim 3 wherein said sequential logic network comprises:

a first portion for processing the plurality of first logic signals, said first portion providing a bit of the coded word;

a second portion for processing the second logic signal and a third logic signal; and at least one multiplexer having a first input coupled to one of the first logic signals, a second input coupled to said second portion, a selection input coupled to the bit provided by said first portion, and an output providing another bit of the coded word.

9. The system of claim 8 wherein the selection input is coupled to the bit provided by said first portion by an inverter.

10. The system of claim 8 wherein said first portion comprises:

a plurality of inverters each having an input and an output, each input receiving one of the first logic signals; and a NAND gate having a plurality of inputs respectively coupled to the outputs of said plurality of inverters and an output which provides the bit of the coded word.

11. The system of claim 8 wherein said second portion comprises:

a plurality of bistable circuits each having a set input, a reset input, and an output, the set inputs being coupled to the second logic signal and the reset inputs being coupled to the third logic signal;

a first NOR gate having a plurality of inputs and an output, the inputs being coupled to respective outputs of said bistable circuits; and a plurality of second NOR gates corresponding in number to the number of the plurality of operating phases, each of said second NOR gates having a plurality of inputs and an output, one of the inputs of each second NOR gate being coupled to the output of said first NOR gate and another of the inputs of each second NOR gate being coupled to the second logic signal.

12. The system of claim 11 wherein the second input of said at least one multiplexer is coupled to the output of one of said second NOR gates.

13. The system of claim 8 wherein the driver has an input; and wherein the system further comprises an auxiliary driving module coupled to the input of the driver, the second logic signal, the third logic signal, and one of the diagnosis logic signals indicating an anomaly detectable in an operating phase in which the driver is active.

14. The system of claim 13 wherein said auxiliary driving module deactivates the driver upon detection of an anomaly in an operating phase in which the driver is active, allows reactivation of the driver following a system reset operation, and deactivates the driver again upon detection that the anomaly remains in the operating phase in which the driver is active.

15. The system of claim 14 wherein said auxiliary driving module comprises a bistable circuit having a set input and a reset input, the set input being coupled to the second logic signal and the third logic signal and the reset input being coupled to the one of the diagnosis logic signals indicating an anomaly detectable in an operating phase in which the driver is active.

16. The system of claim 15 wherein the reset input is coupled by an inverter to the one of the diagnosis logic signals indicating an anomaly detectable in an operating phase in which the driver is active.

17. The system of claim 15 wherein said bistable circuit comprises:

a pair of NAND gates each having an output; and an additional NAND gate coupled to the outputs of the pair of NAND gates and the second logic signal and providing an output signal of said auxiliary driving module.

18. A system for diagnosing a driver and detecting anomalies therein, the driver having at least one diagnosis node and a voltage associated therewith and operating in a plurality of operating phases, the system comprising:

a voltage comparator for comparing the voltage from the at least one diagnosis node to at least one reference voltage and generating a plurality of diagnosis logic signals each indicating a respective type of anomaly; and a coding circuit for receiving the plurality of diagnosis logic signals and providing information relating to an overall operating state of the driver, the information being recognizable by a control unit of the driver, the coding circuit comprising a first circuit portion for storing the plurality of diagnosis logic signals and providing a plurality of corresponding first logic signals each indicating a respective last anomaly to occur after a system reset operation, and a second circuit portion for coding the plurality of first logic signals comprising a sequential logic network having a plurality of inputs and providing a coded word having a plurality of bits and indicating either the presence or absence of an anomaly, said sequential logic network receiving at one input one of the first logic signals and at another input a second logic signal indicating the current operating phase of the driver.

19. The system of claim 18 wherein said sequential logic network provides a stable internal state as a function of the plurality of first logic signals and the second logic signal and outputs the coded word when one of the first logic signals reaches a predetermined logic value indicating the presence of an anomaly.

20. The system of claim 18 wherein said sequential logic network provides a stable internal state as a function of the plurality of first logic signals and the second logic signal and outputs the coded word when the plurality of first logic signals fail to reach a predetermined logic value indicating the presence of respective anomalies where the failure has not been checked for each operating phase of the driver since a system reset operation.

21. The system of claim 18 wherein said sequential logic network provides a stable internal state as a function of the first logic signals and the second logic signal and outputs the coded word when the plurality of first logic signals fail to reach a predetermined logic value indicating the presence of respective anomalies where the failure has been checked for an operating phase of the driver since a system reset operation.

22. The system of claim 18 wherein the plurality of bits comprises N bits; and wherein N is calculated as a function of a number n of anomalies to be detected and a number k of possible operating phases of the driver according to the formula $2N \geq n+k+1$.

23. The system of claim 18 wherein said first circuit portion comprises a respective memory element for each anomaly to be tested, each memory element having a set input for receiving one of the diagnosis logic signals and a plurality of reset inputs for receiving the remaining diagnosis logic signals and a third logic signal indicating a system reset operation.

24. The system of claim 18 wherein said sequential logic network comprises:

a first portion for processing the plurality of first logic signals, said first portion providing a bit of the coded word;

a second portion for processing the second logic signal and a third logic signal; and at least one multiplexer having a first input coupled to one of the first logic signals, a second input coupled to said second portion, a selection input coupled to the bit provided by said first portion, and an output providing another bit of the coded word.

25. The system of claim 24 wherein the selection input is coupled to the bit provided by said first portion by an inverter.

26. The system of claim 24 wherein said first portion comprises:

a plurality of inverters each having an input and an output, each input receiving one of the first logic signals; and a NAND gate having a plurality of inputs respectively coupled to the outputs of said plurality of inverters and an output which provides the bit of the coded word.

27. The system of claim 24 wherein said second portion comprises:

a plurality of bistable circuits each having a set input, a reset input, and an output, the set inputs being coupled to the second logic signal and the reset inputs being coupled to the third logic signal;

a first NOR gate having a plurality of inputs and an output, the inputs being coupled to respective outputs of said bistable circuits; and a plurality of second NOR gates corresponding in number to the number of the plurality of operating phases, each of said second NOR gates having a plurality of inputs and an output, one of the inputs of each second NOR gate being coupled to the output of said first NOR gate and another of the inputs of each second NOR gate being coupled to the second logic signal.

28. The system of claim 27 wherein the second input of said at least one multiplexer is coupled to the output of one of said second NOR gates.

29. The system of claim 24 wherein the driver has an input; and wherein the system further comprises an auxiliary driving module coupled to the input of the driver, the second logic signal, the third logic signal, and one of the diagnosis logic signals indicating an anomaly detectable in an operating phase in which the driver is active.

30. The system of claim 29 wherein said auxiliary driving module deactivates the driver upon detection of an anomaly in an operating phase in which the driver is active, allows reactivation of the driver following a system reset operation, and deactivates the driver again upon detection that the anomaly remains in the operating phase in which the driver is active.

31. The system of claim 30 wherein said auxiliary driving module comprises a bistable circuit having a set input and a reset input, the set input being coupled to the second logic signal and the third logic signal and the reset input being coupled to the one of the diagnosis logic signals indicating an anomaly detectable in an operating phase in which the driver is active.

32. The system of claim 31 wherein the reset input is coupled by an inverter to the one of the diagnosis logic signals indicating an anomaly detectable in an operating phase in which the driver is active.

33. The system of claim 31 wherein said bistable circuit comprises:

a pair of NAND gates each having an output; and an additional NAND gate coupled to the outputs of the pair of NAND gates and the second logic signal and providing an output signal of said auxiliary driving module.

34. A method for diagnosing a driver and detecting anomalies therein, the driver having at least one diagnosis node and a voltage associated therewith and operating in a plurality of operating phases, the method comprising:

comparing the voltage from the at least one diagnosis node to at least one reference voltage;

generating a plurality of diagnosis logic signals based upon the comparison, each diagnosis logic signal indicating a respective type of anomaly;

storing the plurality of diagnosis logic signals; and providing a plurality of first logic signals based upon the plurality of diagnosis logic signals, each first logic signal indicating a respective last anomaly to occur after a system reset operation.

35. The method of claim 34 further comprising:

providing a stable internal state as a function of the plurality of first logic signals and the second logic signal; and outputting a coded word when one of the first logic signals reaches a predetermined logic value indicating the presence of an anomaly.

36. The method of claim 34 further comprising:

providing a stable internal state as a function of the plurality of first logic signals and the second logic signal; and outputting a coded word when the plurality of first logic signals fail to reach a predetermined logic value indicating the presence of respective anomalies where the failure has not been checked for each operating phase of the driver since a system reset operation.

37. The method of claim 34 further comprising:

providing a stable internal state as a function of the first logic signals and the second logic signal; and outputting a coded word when the plurality of first logic signals fail to reach a predetermined logic value indicating the presence of respective anomalies where the failure has been checked for an operating phase of the driver since a system reset operation.

38. The method of claim 34 further comprising:

deactivating the driver upon detection of an anomaly in an operating phase in which the driver is active;

reactivating the driver following a system reset operation; and deactivating the driver again upon detection that the anomaly remains in the operating phase in which the driver is active.

* * * * *